United States Patent
Hwang

(10) Patent No.: US 9,847,327 B2
(45) Date of Patent: Dec. 19, 2017

(54) SWITCHED-CAPACITOR DC-TO-DC CONVERTERS

(71) Applicant: SK hynix Inc., Gyeonggi-do (KR)

(72) Inventor: Jae Ho Hwang, Chungcheongbuk-do (KR)

(73) Assignee: SK Hynix Inc., Gyeonggi-do (KR)

(*) Notice: Subject to any disclaimer, the term of this patent is extended or adjusted under 35 U.S.C. 154(b) by 131 days.

(21) Appl. No.: 14/878,748

(22) Filed: Oct. 8, 2015

(65) Prior Publication Data
US 2016/0329277 A1    Nov. 10, 2016

(30) Foreign Application Priority Data

May 7, 2015  (KR) .................... 10-2015-0064100

(51) Int. Cl.
| | |
|---|---|
| *H01L 27/02* | (2006.01) |
| *H01L 23/522* | (2006.01) |
| *H02M 3/07* | (2006.01) |
| *H01L 49/02* | (2006.01) |

(52) U.S. Cl.
CPC ...... *H01L 27/0222* (2013.01); *H01L 23/5223* (2013.01); *H01L 28/86* (2013.01); *H01L 28/90* (2013.01); *H02M 3/07* (2013.01)

(58) Field of Classification Search
CPC . H01L 27/0222; H01L 27/0629; H01L 28/87; H01L 28/90; H01L 28/86; H01L 28/91; H01L 23/5223; H01L 2924/0002; H02M 3/07; H02M 3/00
See application file for complete search history.

(56) References Cited

U.S. PATENT DOCUMENTS

| | | | |
|---|---|---|---|
| 2012/0091559 A1* | 4/2012 | Tu ................... | H01L 23/5223 257/532 |
| 2013/0242643 A1* | 9/2013 | Kim .................. | G11O 5/14 365/149 |
| 2015/0229208 A1* | 8/2015 | Kim .................. | H01L 28/87 257/299 |
| 2016/0020270 A1* | 1/2016 | Kim .................. | H02M 3/07 257/296 |

FOREIGN PATENT DOCUMENTS

| | | |
|---|---|---|
| KR | 1020040043888 | 5/2004 |
| KR | 1020060078672 | 7/2006 |

* cited by examiner

*Primary Examiner* — Stephen W Smoot
*Assistant Examiner* — Sun M King
(74) *Attorney, Agent, or Firm* — IP & T Group LLP

(57) ABSTRACT

A switched-capacitor DC-to-DC converter includes a first P-channel MOS transistor, a first N-channel MOS transistor, a second P-channel MOS transistor, and a second N-channel MOS transistor which are connected in series. Drain terminals of the first P-channel MOS transistor and the first N-channel MOS transistor are connected to each other through a first node, and drain terminals of the second P-channel MOS transistor and the second N-channel MOS transistor are connected to each other through a second node. A capacitor is coupled between the first and second nodes. The capacitor includes a first capacitor and a second capacitor which are coupled in parallel between the first and second nodes.

13 Claims, 3 Drawing Sheets

SWITCHED-CAPACITOR DC-TO-DC CONVERTERS

CROSS-REFERENCE TO RELATED APPLICATIONS

The present application claims priority under 35 U.S.C 119(a) to Korean Patent Application No 10-2015-0064100 filed on May 7, 2015, which is herein incorporated by reference in its entirety.

BACKGROUND

1. Technical Field

Various embodiments of the present disclosure relate to switched-capacitor Direct Current-to-Direct Current (DC-to-DC) converters.

2. Related Art

Switched power converters used in power supplies may be typically categorized as either switched-inductor converters (SICs) or switched-capacitor converters (SCCs). The SICs may store energy in their inductors while the SICs convert a source of direct current (DC) from one voltage level into another voltage level, and the SCCs may store energy in their capacitors while the SCCs convert a source of direct current (DC) from one voltage level into another voltage level. The SICs may exhibit a wide operating range and a high efficiency. Thus, the SICs have been widely used in a high power device. However, there may be some limitations in employing the SICs in compact systems since inductors of the SICs occupy a relatively large area. Nevertheless, the SCCs may be suitable for low power systems having a compact size since capacitors of the SCCs occupy a relatively small area as compared with the inductors of the SICs. Recently, the SCCs have been widely used in mobile systems due to their compact size and low electromagnetic interference. However, it may be difficult to integrate a capacitor having a high capacitance value and a complementary metal-oxide-semiconductor (CMOS) circuit constituting the SCC in a single chip. Thus, a capacitor having a high capacitance value has been positioned in an outside region of a semiconductor chip.

SUMMARY

Various embodiments are directed to switched-capacitor DC-to-DC converters. According to one embodiment, a switched-capacitor DC-to-DC converter includes a first P-channel MOS transistor, a first N-channel MOS transistor, a second P-channel MOS transistor, a second N-channel MOS transistor, and a capacitor. The first P-channel MOS transistor has a gate terminal connected to a gate voltage input terminal, a source terminal connected to an input voltage terminal, and a drain terminal connected to a first node. The first N-channel MOS transistor has a gate terminal connected to the gate voltage input terminal, a source terminal connected to an output voltage terminal, and a drain terminal connected to the first node. The second P-channel MOS transistor has a gate terminal connected to the gate voltage input terminal, a drain terminal connected to a second node, and a source terminal connected to the output voltage terminal. The second N-channel MOS transistor has a gate terminal connected to the gate voltage input terminal, a drain terminal connected to the second node, and a source terminal connected to a ground terminal. The capacitor is coupled between the first node and the second node. The capacitor includes a first capacitor and a second capacitor. The first capacitor has a first lower electrode terminal coupled to the second node and a first upper electrode terminal coupled to the first node. The second capacitor has a second lower electrode terminal coupled to the first node and a second upper electrode terminal coupled to the second node.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under", "beneath," "below", "lower," "on", "over", "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the scope of the present disclosure. Other words used to describe the relationship between elements or layers should be interpreted in a like fashion (e.g., "between" versus "directly between" or "adjacent" versus "directly adjacent").

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
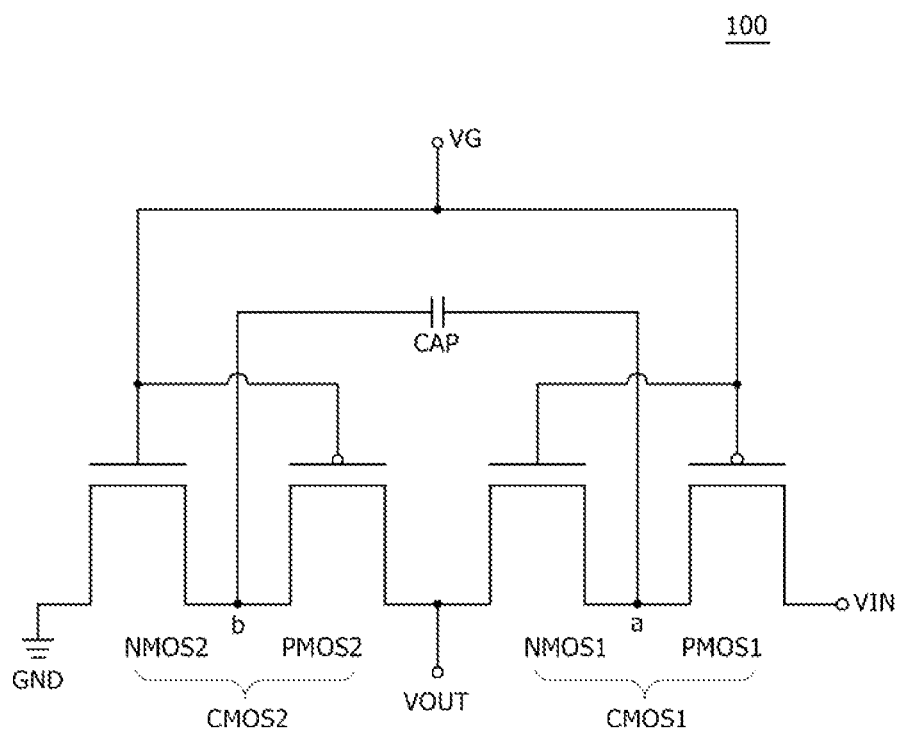
FIG. 1 is a circuit diagram illustrating a switched-capacitor DC-to-DC converter according to an embodiment.

FIG. 1 is a circuit diagram illustrating a switched-capacitor DC-to-DC converter 100 according to an embodiment. Referring to FIG. 1, the switched-capacitor DC-to-DC converter 100 may be configured to include a first CMOS logic CMOS1, a second CMOS logic CMOS2, and a capacitor CAP. The first CMOS logic CMOS1 may include a first N-channel MOS transistor NMOS1 and a first P-channel MOS transistor PMOS1. The second CMOS logic CMOS2 may include a second N-channel MOS transistor NMOS2 and a second P-channel MOS transistor PMOS2.

Each of the first and second N-channel MOS transistors NMOS1 and NMOS2 may have a source terminal corresponding to an N-type source region and a drain terminal corresponding to an N-type drain region. Each of the first and second P-channel MOS transistors PMOS1 and PMOS2 may have a source terminal corresponding to a P-type source region and a drain terminal corresponding to a P-type drain region.

The source terminal and the drain terminal of the first P-channel MOS transistor PMOS1 may be connected to an input voltage terminal VIN and the drain terminal of the first N-channel MOS transistor NMOS1, respectively.

The source terminal of the first N-channel MOS transistor NMOS1 may be connected to an output voltage terminal VOUT. The source terminal and the drain terminal of the second P-channel MOS transistor PMOS2 may be connected to the output voltage terminal VOUT and the drain terminal of the second N-channel MOS transistor NMOS2, respectively.

The source terminal of the second N-channel MOS transistor NMOS2 may be connected to a ground terminal GND. One terminal of the capacitor CAP may be connected to a connection node "a" that connects the drain terminal of the first P-channel MOS transistor PMOS1 to the drain terminal of the first N-channel MOS transistor NMOS1. The other terminal of the capacitor CAP may be connected to a connection node "b" that connects the drain terminal of the second P-channel MOS transistor PMOS2 to the drain terminal of the second N-channel MOS transistor NMOS2.

Gate terminals of the first P-channel MOS transistor PMOS1 and the first N-channel MOS transistor NMOS1 as well as gate terminals of the second P-channel MOS transistor PMOS2 and the second N-channel MOS transistor NMOS2 may be connected to a gate voltage input terminal VG in common.

The switched capacitor DC-to-DC converter 100 according to the present embodiment may function as a DC-to-DC converter that converts a source of direct current (DC) from one voltage level to another voltage level. The conversion may be performed by two operation steps, for example, a charging step and a discharging step.

During the operation of the switched capacitor DC-to-DC converter 100, a clock signal may be inputted to the switched capacitor DC-to-DC converter 100 through the gate voltage input terminal VG. Specifically, in the charging step, a gate voltage signal lower than a certain voltage level such as, a threshold voltage of the first and second N-channel MOS transistors NMOS1 and NMOS2, for example, a gate voltage signal having a ground voltage level may be applied to the gate voltage input terminal VG. Accordingly, while the first and second P-channel MOS transistors PMOS1 and PMOS2 are turned on, the first and second N-channel MOS transistors NMOS1 and NMOS2 may be turned off.

In such a case, a current path may be provided between the input voltage terminal VIN and the output voltage terminal VOUT through the connection node "a", the capacitor CAP and the connection node "b". The capacitor CAP may be charged to store a certain amount of electric charges therein if an input voltage signal is applied to the input voltage terminal VIN.

In the discharging step, a gate voltage signal higher than a certain voltage level such as, a threshold voltage of the first and second N-channel MOS transistors NMOS1 and NMOS2, for example, a gate voltage signal of 5 volts may be applied to the gate voltage input terminal VG. Accordingly, while the first and second N-channel MOS transistors NMOS1 and NMOS2 are turned on, the first and second P-channel MOS transistors PMOS1 and PMOS2 may be turned off. In such a case, both terminals of the capacitor CAP may be connected to the ground terminal GND and the output voltage terminal VOUT, respectively. Thus, the charged capacitor CAP may serve as a voltage source to output a voltage having a different level from the input voltage signal through the output voltage terminal VOUT.

Figure 2:
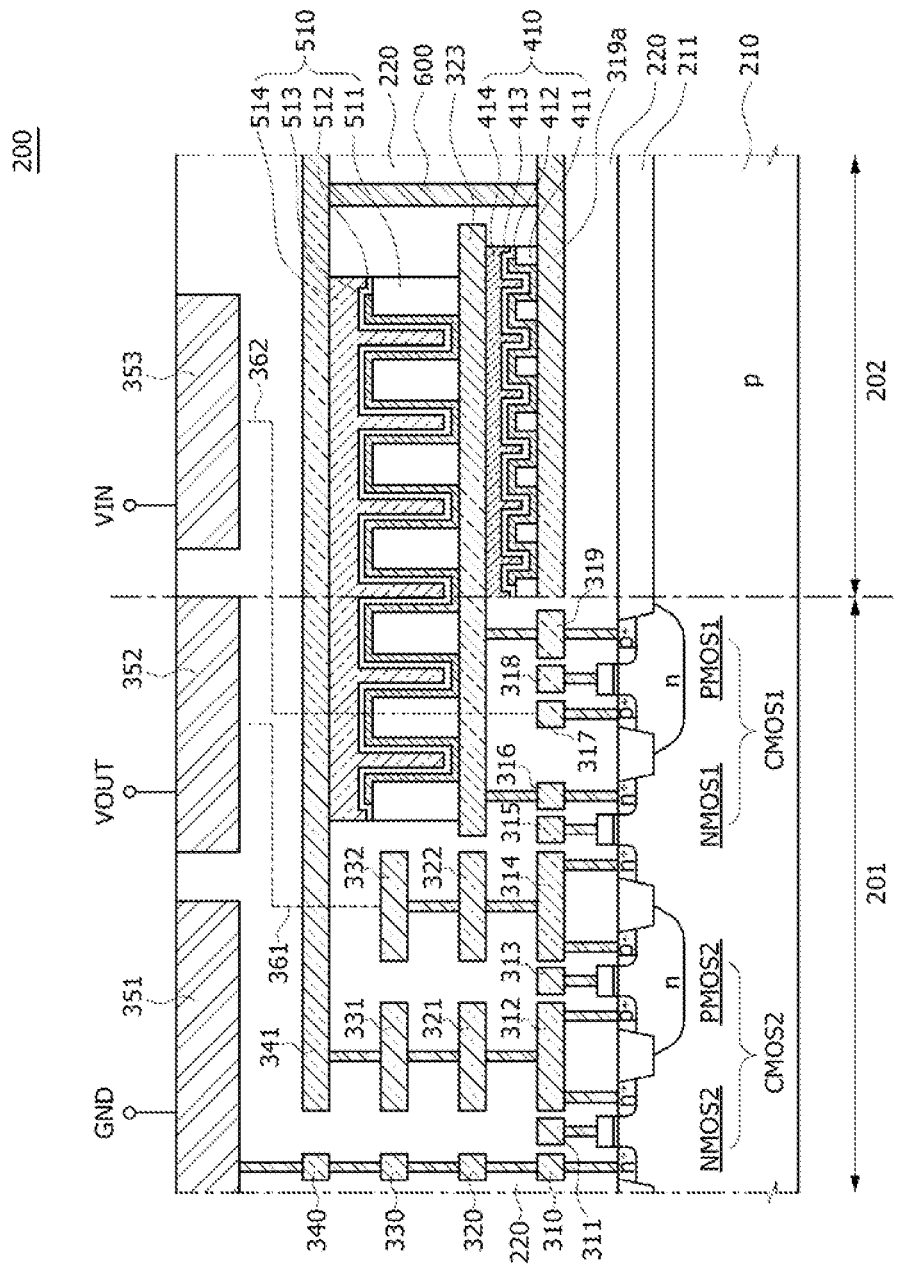
FIG. 2 is a cross-sectional view illustrating a switched-capacitor DC-to-DC converter according to an embodiment.

FIG. 2 is a cross-sectional view illustrating a switched-capacitor DC-to-DC converter 200 according to an embodiment. Referring to FIG. 2, the switched-capacitor DC-to-DC converter 200 may include a first region 201 and a second region 202 that are disposed to be adjacent to each other along a horizontal direction which is parallel with a surface of a substrate 210. Switching elements and a single-layered capacitor may be disposed in the first region 201. A multi-layered capacitor may be disposed in the second region 202.

The first region 201 may be defined as a region in which active elements such as switching elements are disposed, and the second region 202 may be defined as a region in which no active element is disposed. In some embodiments, the substrate 210 may be a P-type substrate. The first and second CMOS logics CMOS1 and CMOS2 corresponding to switching elements may be disposed in the first region 201. The first CMOS logic CMOS1 may include a first P-channel MOS transistor PMOS1 and a first N-channel MOS transistor NMOS1. The second CMOS logic CMOS2 may include a second P-channel MOS transistor PMOS2 and a second N-channel MOS transistor NMOS2.

A second capacitor 510 having a single-layered structure may be disposed on the switching elements in the first region 201. A first capacitor 410 may be disposed in the second region 202. The second capacitor 510 may extend onto the first capacitor 410. Accordingly, the second region 202 may include the first capacitor 410 and a portion of the second capacitor 510 which are sequentially stacked to constitute a multi-layered structural capacitor.

A plurality of junction regions may be disposed in an upper region of the substrate 210 in the first region 201. The plurality of junction regions may include source regions and drain regions. A channel region may be defined between the source region and the drain region which are adjacent to each other, and a gate insulation layer and a gate electrode may be sequentially stacked on the channel region.

The source regions and the drain regions of the first and second P-channel MOS transistors PMOS1 and PMOS2 may be P-type impurity regions. The P-type source region and the P-type drain region of the first P-channel MOS transistor PMOS1 may be surrounded by an N-type well region. The P-type source region and the P-type drain region of the second P-channel MOS transistor PMOS2 may be surrounded by another N-type well region.

The source regions and the drain regions of the first and second N-channel MOS transistors NMOS1 and NMOS2 may be N-type impurity regions. The first and second P-channel MOS transistors PMOS1 and PMOS2 and the first and second N-channel MOS transistors NMOS1 and NMOS2 may be isolated from each other by a trench isolation layer 211 that is disposed in an upper region of the substrate 210.

An insulation layer 220 may be disposed on the substrate 210 in the first and second regions 201 and 202 to cover the first and second CMOS logics CMOS1 and CMOS2. The insulation layer 220 is not divided into a plurality of layers in FIG. 2. However in another embodiment, the insulation layer 220 may have a multi-layered structure.

A multi-level interconnection structure may be disposed in the insulation layer 220. The multi-level interconnection structure may include first interconnection patterns 310~319 and 319a which are disposed at a lowermost level. The multi-level interconnection structure may further include second interconnection patterns 320~323 third interconnection patterns 330~332, fourth interconnection patterns 340~341, and fifth interconnection patterns 351~353 which are vertically stacked on the first interconnection patterns 310~319 and 319a.

The first interconnection patterns 310 may be electrically connected to the source region of the second N-channel MOS transistor NMOS2 through a via plug. The first interconnection patterns 311, 313, 315 and 318 may be electrically connected to the gate electrode of the second N-channel MOS transistor NMOS2, the gate electrode of the second P-channel MOS transistor PMOS2, the gate electrode of the first N-channel MOS transistor NMOS1, and the gate electrode of the first P-channel MOS transistor PMOS1 through via plugs, respectively.

Although not illustrated in FIG. 2, the first interconnection patterns 311, 313, 315 and 318 may be electrically and commonly connected to a gate voltage input terminal corresponding to the gate voltage input terminal VG of FIG. 1. The first interconnection pattern 312 may be electrically connected to the drain region of the second N-channel MOS transistor NMOS2 and the drain region of the second P-channel MOS transistor PMOS2 through via plugs. The first interconnection pattern 314 may be electrically connected to the source region of the second P-channel MOS transistor PMOS2 and the source region of the first N-channel MOS transistor NMOS1 through via plugs.

The first interconnection pattern 316 may be electrically connected to the drain region of the first N-channel MOS transistor NMOS1 through a via plug. The first interconnection patterns 317 and 319 may be electrically connected to the source region and the drain region of the first P-channel MOS transistor PMOS1 through via plugs, respectively.

The first interconnection pattern 310 may be electrically connected to the fifth interconnection pattern 351, which is located at an uppermost level, respectively through the second, third and fourth interconnection patterns 320, 330 and 340. The first, second, third, fourth and fifth interconnection patterns 310, 320, 330, 340 and 351 may be electrically connected to each other through via plugs therebetween. The fifth interconnection pattern 351 may be electrically connected to a ground pad GND.

In some other embodiments, the fifth interconnection pattern 351 may serve as the ground pad GND. Thus, the source region of the second N-channel MOS transistor NMOS2 may be electrically connected to the ground pad GND. The first interconnection pattern 312 may be electrically connected to the fourth interconnection pattern 341 through the second and third interconnection patterns 321 and 331.

The first, second, third and fourth interconnection patterns 312, 321, 331 and 341 may be electrically connected to each other through via plugs therebetween. The fourth interconnection pattern 341 may extend into the second region 202. A bottom surface of the fourth interconnection pattern 341 may contact a second upper metal pattern 514 of the second capacitor 510 disposed in the first and second regions 201 and 202.

The first interconnection pattern 314 may be electrically connected to the fifth interconnection pattern 352 through the second and third interconnection patterns 322 and 332. The first, second, third and fifth interconnection patterns 314, 322, 332 and 352 may be electrically connected to each other through via plugs therebetween. An interconnection structure between the third interconnection pattern 332 and the fifth interconnection pattern 352 is not illustrated in FIG. 2. However, as indicated by a dotted line 361 in FIG. 2, the third interconnection pattern 332 and the fifth interconnection pattern 352 may be electrically connected to each other through any one of various interconnection structures, for example, through a via plug and another fourth interconnection pattern (not shown). The fifth interconnection pattern 352 may be electrically connected to an output voltage pad VOUT. Thus, the source region of the second P-channel MOS transistor PMOS2 and the source region of the first N-channel MOS transistor NMOS1 may be electrically and commonly connected to the output voltage pad VOUT.

The first interconnection patterns 316 and 319 may be electrically connected to the second interconnection pattern 323. The first interconnection patterns 316 and 319 and the second interconnection pattern 323 may be electrically connected to each other through via plugs therebetween. A bottom surface of the second interconnection pattern 323 may be electrically connected to a first upper metal pattern 414 of the first capacitor 410 disposed in the second region 202. A top surface of the second interconnection pattern 323 may be electrically connected to a second lower metal pattern 512 of the second capacitor 510 disposed in the first and second regions 201 and 202. Accordingly, the drain regions of the first N-channel MOS transistor NMOS1 and the first P-channel MOS transistor PMOS1 may be electrically connected to the first upper metal pattern 414 of the first capacitor 410 and the second lower metal pattern 512 of the second capacitor 510.

The first interconnection pattern 317 may be electrically connected to the fifth interconnection pattern 353. An interconnection structure between the first interconnection pattern 317 and the fifth interconnection pattern 353 is not illustrated in FIG. 2. However, as indicated by a dotted line 362 in FIG. 2, the first interconnection pattern 317 and the fifth interconnection pattern 353 may be electrically connected to each other through any one of various interconnection structures, for example, through a via plug and other third and fourth interconnection patterns (not shown). The fifth interconnection pattern 353 may be electrically connected to an input voltage pad VIN. Thus, the source region of the first P-channel MOS transistor PMOS1 may be electrically connected to the input voltage pad VIN.

The trench isolation layer 211 may also be disposed in an upper region of the substrate 210 in the second region 202. Although not shown in FIG. 2, in other embodiments, passive elements such as resistors and/or inductors may be disposed on the substrate 210 in the second region 202.

The first interconnection pattern 319a may be disposed in the insulation layer 220 disposed on the substrate 210 in the second region 202. The first interconnection pattern 319a may be disposed at substantially the same horizontal level as the other first interconnection patterns 310~319 in the first region 201. The first interconnection patterns 310~319 and 319a may be simultaneously formed by the same process. The first interconnection pattern 319a may be electrically isolated from the first interconnection patterns 310~319.

A first dummy insulation pattern 411 having a plurality of contact holes may be disposed on the first interconnection pattern 319a. The first dummy insulation pattern 411 may correspond to a portion of the insulation layer 220. In such a case, the first dummy insulation pattern 411 may be formed by depositing a portion of the insulation layer 220 in the first and second regions 201 and 202 and by patterning the portion of the insulation layer 220 in the second region 202 using a mask pattern to form the contact holes exposing portions of the first interconnection pattern 319a.

A first lower metal pattern 412 may be disposed on the first dummy insulation pattern 411 and in the contact holes exposing the portions of the first interconnection pattern 319a. A first dielectric pattern 413 and the first upper metal pattern 414 may be sequentially stacked on the first lower metal pattern 412. The first lower metal pattern 412, the first dielectric pattern 413 and the first upper metal pattern 414 may constitute the first capacitor 410. A top surface of the first upper metal pattern 414 may contact a bottom surface of the second interconnection pattern 323 in the second region 202. The first interconnection pattern 319a may be electrically connected to the fourth interconnection pattern 341 through a via plug 600.

A second dummy insulation pattern 511 having a plurality of contact holes may be disposed on the second interconnection pattern 323 which is provided in the first and second regions 201 and 202. The second dummy insulation pattern 511 may be part of the insulation layer 220. In such a case, the second dummy insulation pattern 511 may be formed by depositing the insulation layer 220 in the first and second regions 201 and 202 and by patterning the insulation layer 220 in the first and second regions 201 and 202 using a mask pattern to form the contact holes exposing portions of the second interconnection pattern 323.

The second lower metal pattern 512 may be disposed on the second dummy insulation pattern 511 and in the contact holes exposing the portions of the second interconnection pattern 323. A second dielectric pattern 513 and the second upper metal pattern 514 may be sequentially stacked on the second lower metal pattern 512. The second lower metal pattern 512, the second dielectric pattern 513 and the second upper metal pattern 514 may constitute the second capacitor 510. A top surface of the second upper metal pattern 514 may contact a bottom surface of the fourth interconnection pattern 341 in the first and second regions 201 and 202.

As described above, according to the embodiments, a plurality of capacitors may be vertically stacked. In particular, the first capacitor 410 and the second capacitor 510 may be vertically stacked in the second region 202, and the second capacitor 510 may extend into the first region 201. Thus, a planar area that the first and second capacitors 410 and 510 occupy may be reduced to increase an integration density of the switched capacitor DC-to-DC converter.

Figure 3:
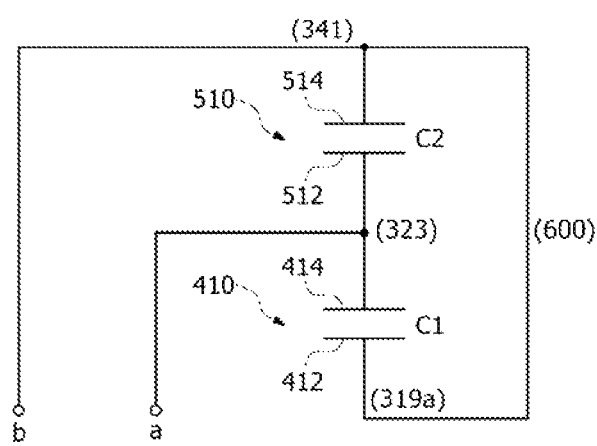
FIG. 3 is an equivalent circuit diagram illustrating a multi-layered capacitor employed in the switched-capacitor DC-to-DC converter of FIG. 2.

FIG. 3 is an equivalent circuit diagram illustrating a multi-layered structural capacitor employed in the switched-capacitor DC-to-DC converter of FIG. 2. Referring to FIGS. 2 and 3, the first capacitor 410 may have a first lower electrode terminal and a first upper electrode terminal that correspond to the first lower metal pattern 412 and the first upper metal pattern 414, respectively.

Similarly, the second capacitor 510 may have a second lower electrode terminal and a second upper electrode terminal that correspond to the second lower metal pattern 512 and the second upper metal pattern 514, respectively. The first lower metal pattern 412 of the first capacitor 410 may be electrically coupled to the first interconnection pattern 319a.

The first upper metal pattern 414 of the first capacitor 410 may be electrically coupled to the connection node "a" through the second interconnection pattern 323. The second lower metal pattern 512 of the second capacitor 510 may be electrically coupled to the connection node "a" through the second interconnection pattern 323. Thus, the first upper metal pattern 414 of the first capacitor 410 and the second lower metal pattern 512 of the second capacitor 510 may be electrically and commonly coupled to the second interconnection pattern 323.

The second upper metal pattern 514 of the second capacitor 510 may be electrically coupled to the connection node "b" through the fourth interconnection pattern 341. Since the first interconnection pattern 319a is electrically coupled to the fourth interconnection pattern 341 through the via plug 600, the second upper metal pattern 514 of the second capacitor 510 and the first lower metal pattern 412 of the first capacitor 410 may be electrically and commonly coupled to the connection node "b".

As a result, the first and second capacitors 410 and 510 may be coupled in parallel between the connection node "a" and the connection node "b". Accordingly, since a total capacitance value between the connection node "a" and the connection node "b" may correspond to a sum of a capacitance value of the first capacitor 410 and a capacitance value of the second capacitor 510, a total capacitance value of the capacitor of the switched-capacitor DC-to-DC converter 200 may increase.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A switched-capacitor DC-to-DC converter comprising:
a first P-channel MOS transistor having a gate terminal connected to a gate voltage input terminal, a source terminal connected to an input voltage terminal, and a drain terminal connected to a first node;
a first N-channel MOS transistor having a gate terminal connected to the gate voltage input terminal, a source terminal connected to an output voltage terminal, and a drain terminal connected to the first node;
a second P-channel MOS transistor having a gate terminal connected to the gate voltage input terminal, a drain terminal connected to a second node, and a source terminal connected to the output voltage terminal;
a second N-channel MOS transistor having a gate terminal connected to the gate voltage input terminal, a drain terminal connected to the second node, and a source terminal connected to a ground terminal; and
a capacitor coupled between the first node and the second node,
wherein the capacitor comprises:
a first capacitor having a first lower electrode terminal coupled to the second node and a first upper electrode terminal coupled to the first node; and
a second capacitor having a second lower electrode terminal coupled to the first node and a second upper electrode terminal coupled to the second node, and
wherein the substrate includes first and second regions;
wherein the first P-channel MOS transistor, the first N-channel MOS transistor, the second P-channel MOS transistor, and the second N-channel MOS transistor are disposed over the substrate located in the first region;
wherein the first capacitor is disposed over the substrate located in the second region and does not extend to the first region; and
wherein the second capacitor is disposed over the substrate located in the first region and extends to the second region.

2. The switched-capacitor DC-to-DC converter of claim 1, wherein the first capacitor and the second capacitor vertically overlap with each other over the substrate in the second region.

3. The switched-capacitor DC-to-DC converter of claim 1, wherein the first capacitor includes:
a first interconnection pattern provided over the substrate;

a first dummy insulation pattern disposed over the first interconnection pattern and having a plurality of contact holes exposing the first interconnection pattern;

a first lower metal pattern disposed over the first dummy insulation pattern and in the contact holes of the first dummy insulation pattern;

a first dielectric pattern disposed over the first lower metal pattern; and a first upper metal pattern disposed over the first dielectric pattern.

4. The switched-capacitor DC-to-DC converter of claim 3, further comprising:

a second interconnection pattern disposed over the substrate in the first and second regions, wherein the first upper metal pattern is electrically connected to the second interconnection pattern.

5. The switched-capacitor DC-to-DC converter of claim 4, wherein a top surface of the first upper metal pattern contacts a bottom surface of the second interconnection pattern.

6. The switched-capacitor DC-to-DC converter of claim 4, wherein the second capacitor includes:

a second dummy insulation pattern disposed over the second interconnection pattern and having a plurality of contact holes exposing the second interconnection pattern;

a second lower metal pattern disposed over the second dummy insulation pattern and in the contact holes of the second dummy insulation pattern;

a second dielectric pattern disposed over the second lower metal pattern; and a second upper metal pattern disposed over the second dielectric pattern.

7. The switched-capacitor DC-to-DC converter of claim 6, further comprising:

a fourth interconnection pattern disposed over the substrate in the first and second regions, wherein the second upper metal pattern is electrically connected to the fourth interconnection pattern.

8. The switched-capacitor DC-to-DC converter of claim 7, wherein a top surface of the second upper metal pattern contacts a bottom surface of the fourth interconnection pattern.

9. The switched-capacitor DC-to-DC converter of claim 7, wherein the first interconnection pattern and the fourth interconnection pattern are electrically connected to each other through a via plug.

10. The switched-capacitor DC-to-DC converter of claim 7, wherein the second interconnection pattern is electrically connected to both of the drain terminal of the first P-channel MOS transistor and the drain terminal of the first N-channel MOS transistor in the first region.

11. The switched-capacitor DC-to-DC converter of claim 10, further comprising:

an additional first interconnection pattern disposed over the substrate in the first region and is not formed in the second region, wherein the additional first interconnection pattern is electrically connected to both of the drain terminal of the second P-channel MOS transistor and the drain terminal of the second N-channel MOS transistor.

12. The switched-capacitor DC-to-DC converter of claim 11, wherein the additional first interconnection pattern is electrically connected to the fourth interconnection pattern.

13. The switched-capacitor DC-to-DC converter of claim 12, wherein the additional first interconnection pattern formed in the first region is formed at substantially the same level as the first interconnection pattern formed in the second region, wherein the first capacitor is formed at a higher level than the additional first interconnection pattern and at a lower level than the second interconnection pattern, and wherein the second capacitor is formed at a higher level than the second interconnection pattern and at a lower level than the fourth interconnection pattern.

* * * * *